United States Patent [19]

Rouy

[11] Patent Number: 5,483,492
[45] Date of Patent: Jan. 9, 1996

[54] METHOD AND APPARATUS FOR CHECKING POST-ERASURE CONTENTS OF AN ERASABLE PERMANENT MEMORY

[75] Inventor: Olivier Rouy, Rousset, France

[73] Assignee: SGS-Thomson Microelectronics S.A., Saint-Genis, France

[21] Appl. No.: 75,543

[22] PCT Filed: Oct. 9, 1992

[86] PCT No.: PCT/FR92/00951

§ 371 Date: Jun. 11, 1993

§ 102(e) Date: Jun. 11, 1993

[87] PCT Pub. No.: WO93/07621

PCT Pub. Date: Apr. 15, 1993

[30] Foreign Application Priority Data

Oct. 11, 1991 [FR] France .................................. 91 12538

[51] Int. Cl.⁶ .................................................. G11C 29/00
[52] U.S. Cl. ............................................................ 365/201
[58] Field of Search .............................. 371/21.1, 21.2, 371/21.3, 21.4, 28; 365/201

[56] References Cited

U.S. PATENT DOCUMENTS

| | | | |
|---|---|---|---|
| 3,727,039 | 4/1973 | Baker et al. ........................... | 371/21.2 |
| 4,430,735 | 2/1984 | Catiller ................................. | 371/21.2 |
| 4,680,762 | 7/1987 | Hardee et al. ........................ | 371/21.2 |
| 4,905,191 | 2/1990 | Arai ...................................... | 371/21.25 |
| 4,926,424 | 5/1990 | Maeno .................................. | 371/21.2 |
| 4,942,576 | 7/1990 | Busach et al. ........................ | 371/21.2 |
| 4,972,372 | 11/1990 | Ueno ..................................... | 371/21.2 |
| 5,023,874 | 6/1991 | Houston ................................ | 371/21.2 |
| 5,062,109 | 10/1991 | Ohshima et al. ..................... | 371/21.2 |
| 5,325,367 | 6/1994 | Dekker et al. ........................ | 371/21.1 |

OTHER PUBLICATIONS

Nakayama et al "A 60 ns 16-Mb Flash EEPROM with Program and Erase Sequence Controller" IEEE Journal of Solid State Circuits vol. 26, No. 11, Nov. 1991.

*Primary Examiner*—Robert W. Beausoliel, Jr.
*Assistant Examiner*—Joseph E. Palys
*Attorney, Agent, or Firm*—David M. Driscoll; James H. Morris

[57] ABSTRACT

A method of checking post-erasure contents of an erasable permanent memory containing an instruction register and an address register, the method including steps of writing an erasure-checking instruction word into the instruction register, and timing-out for a predetermined duration. The step of writing the instruction word to the instruction register also initiates the steps of opening of the address register, presenting a first address to the address register, iteratively reading the contents of the memory at the address indicated by the address register and incrementing the presented address until the entire memory has been checked, and closing the address register. A device for implementing this method includes a circuit for generating an address-transfer enable signal applied to the address register.

8 Claims, 3 Drawing Sheets

```
                    ┌─────────┐
                    │  START  │
                    └────┬────┘
                         ▼
                ┌─────────────────┐  ⎫
                │   Vpp = Vpp1    │  ⎬ I
                └────────┬────────┘  ⎪
                         ▼           ⎪
                ┌─────────────────┐  ⎪
                │ INITIALIZATION  │  ⎭
                └────────┬────────┘
                         ▼
       ┌─────────────────────────────────┐  ⎫
       │ WRITE AN ERASURE PREPARATION    │  ⎪
       │ INSTRUCTION INTO THE            │──E1
       │ INSTRUCTION REGISTER RC         │  ⎪
       └─────────────────┬───────────────┘  ⎪
                         ▼                  ⎬ E
       ┌─────────────────────────────────┐  ⎪
       │ WRITE AN ERASURE INSTRUCTION    │  ⎪
       │ INTO THE INSTRUCTION            │──E2
       │ REGISTER RC                     │  ⎪
       └─────────────────┬───────────────┘  ⎭
                         ▼
       A ──▶ ┌─────────────────────┐──TE         TN    NO
             │   TIME-OUT   T1     │          ◀────⟨ TEST ⟩────▶
             └──────────┬──────────┘                 N    YES
                        ▼                                   │
       ┌─────────────────────────────────┐                  ▼
       │ WRITE AN ERASURE-CHECKING       │──V1      ┌───────────┐
       │ INSTRUCTION INTO THE            │          │ Vpp=Vpp1  │
       │ INSTRUCTION REGISTER RC         │          └─────┬─────┘
       └─────────────────┬───────────────┘                ▼
                         ▼                          ┌─────────┐
             ┌─────────────────────┐──TV            │  FAULT  │
             │   TIME-OUT   T2     │                └─────────┘ ─D
             └──────────┬──────────┘
                        ▼
             ┌─────────────────────┐──VL
             │   READ THE DATUM D  │
             └──────────┬──────────┘
                        ▼        NO
                   ⟨ D = FFH ⟩────────▶
                        │ YES     V2
       B ──▶            ▼
                   ⟨ LAST ADDRESS ⟩──V3
                    NO │    YES
                       ▼
             ┌─────────────────────┐
             │   Vpp = Vpp    END  │──F
             └─────────────────────┘
```

METHOD AND APPARATUS FOR CHECKING POST-ERASURE CONTENTS OF AN ERASABLE PERMANENT MEMORY

BACKGROUND OF THE INVENTION

1. Field of the Invention

The present invention relates to a method of checking the post-erasure contents of an erasable permanent memory, especially of EPROM type.

It also concerns a device for its implementation as well as a memory incorporating this device.

2. Discussion of the Related Art

Rational use of erasable permanent memories, especially of EPROM type, involves systematic checking of the contents of these memories after every erasure operation.

Now, hitherto, the checking of the contents of a memory after erasure was performed by writing an instruction into an instruction register of the memory, having the effect of storing the value of an address and of reading the contents at this address after a necessary recovery time which, by way of example, may be of the order of 6 µs.

This operation of writing an instruction and of reading must be performed for each address to be checked, this entailing significant loss of time in an industrial context. Furthermore, such checking is performed several times while the memory has not been acknowledged to be completely erased, which may lead to a total checking time greater than a second.

SUMMARY OF THE INVENTION

An aim of the invention is to remedy these disadvantages by providing a method of checking the post-erasure contents of an erasable permanent memory endowed with an instruction register and with an address register, comprising a first step of writing an erasure-checking instruction word into this instruction register, followed by a second step of timing-out of predetermined duration.

According to the invention, the first step of writing the instruction word initiates the following sequence:

opening of the address register, presentation of a first address, iterative looping of reading the contents at the address concerned and incrementation of this address until the entire memory has been checked, and closure of the address register.

Thus, with the method according to the invention, the entire checking includes just a single write operation and therefore requires just a single recovery time-out. With the address register of the memory being kept open throughout the duration of the checking, the internal address bus of the memory is then in direct communication with the bus of the digital system within which the relevant memory is situated and the reading of the memory plane may be performed at a frequency which is not limited by the recovery time related to the implementation of a write cycle.

According to a preferred form of the invention, the loop comprises a step of reading the memory datum held in the current address, followed by a step of comparison of said datum with a reference erasure datum, said step of comparison leading either to a new iteration in the case of identity, or to the execution of a new erasure sequence in the case of non-identity.

2

According to another aspect of the invention, the device for checking the post-erasure contents of an erasable permanent memory, especially of EPROM type, said memory comprising an address register, an instruction register connected to an internal databus via a status decoder, and an edge detector receiving as input a write enable signal, implementing the above method, is such that it furthermore comprises means for generating an address-transfer enable signal applied to the address register on the basis of a fast erasure-checking signal generated by the instruction register and of an address clock signal generated by the edge detector.

Moreover, the aforesaid device may be incorporated with EPROM memories with various structures.

Other features of the invention will emerge further from the description below.

BRIEF DESCRIPTION OF THE DRAWINGS

In the attached drawings given by way of nonlimiting examples:

FIG. 1 is a flow diagram explaining the essential steps of an erasure algorithm implementing the method according to the invention;

DETAILED DESCRIPTION

Figure 2:
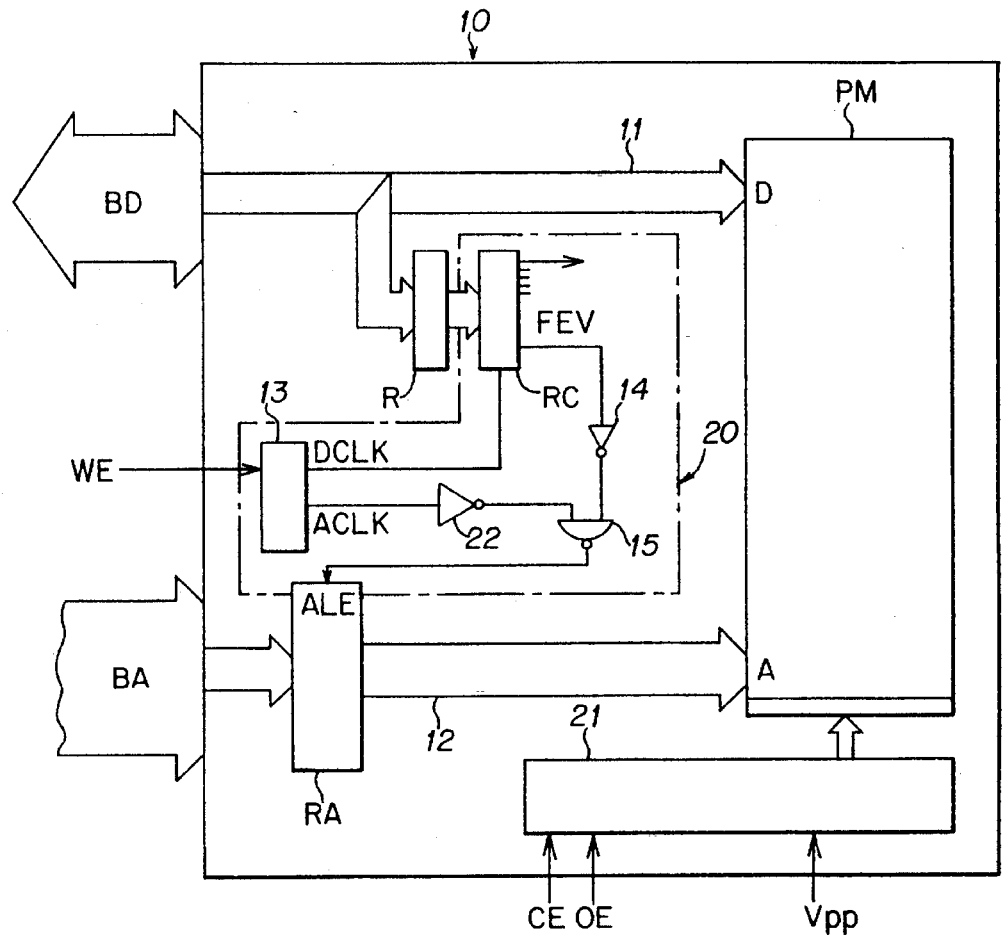
FIG. 2 is a simplified functional diagram of an embodiment of the device according to the invention.

The method according to the invention will now be described in detail together with the device for its implementation, with reference to FIGS. 1 to 4.

The method of checking according to the invention is in practice contained within an erasure algorithm associated with a specified family of erasable memories and in particular memories of EPROM type, and this will be the case in the remainder of the description. This algorithm A comprises, generally, and with reference to FIG. 1, an initializing sequence I, an erasure instruction sequence E, an erasure-checking sequence V which constitutes the method according to the invention, these being followed either by an end sequence F in the case of normal execution of the algorithm, or by a fault detection sequence D. This algorithm is executed by the outside digital system with which is associated an EPROM memory 10, with reference to FIG. 4, relating to the erasure procedure, with reference to FIG. 2.

During the initializing sequence I, a programming voltage Vpph of high level is applied to an appropriate input Vpp of the memory 10. The erasure instruction sequence comprises a step E1 of writing an erasure preparation instruction into an instruction register RC of the memory 10. This step causes the setting of internal registers of the memory to erasure mode. It is followed by a step E2 of writing an erasure instruction into the instruction register RC, succeeded by a step TE of timing-out of predetermined duration T1, for example of the order of 10 ms. It should be noted that the aforesaid sequences and steps correspond to the present state of the art within the field of programmable memories.

On completion of the time-out T1, the outside digital system performs a step V1 of writing an erasure-checking instruction into the instruction register RC of the memory 10, immediately followed by a step TV of timing-out of predetermined duration T2, for example of the order of 6 µs, required to guarantee the stabilizing of the static circuitries for reading the memory in erasure-checking mode. On completion of the time-out T2, a specific read and test loop B of the invention is executed on all the addresses of the memory 10 concerned. Each iteration of the loop comprises a step VL of reading the datum D present at the current address, a step V2 of comparison of the datum read D with $FF_H$ which represents the normal digital contents expected after erasure and which therefore constitutes an erasure reference value. If the comparison is satisfactory, an address test V3 is performed so as to lead either to an incrementation of said address and to an iteration of the loop, or, when the entire memory has been inspected, to the end-of-algorithm sequence F during which a low level Vppl is applied to the programming input Vpp.

If during the comparison step V2 a datum not equal to $FF_H$ is detected, a new erasure sequence E and a new checking sequence V are undertaken iteratively until the erasure-checking is satisfactory. A test TN on the number N of sequences performed makes it possible to limit these sequences to a predetermined number, for example equal to 3000. Thereafter, the fault indication sequence D for the memory 10 is performed, during which the programming voltage Vpp is returned to the low level. It should be noted that the novelty in the invention lies in the fact that the read and test loop contains neither the sequence for writing the erasure-checking instruction, nor the time-out of duration T2, this contributing significantly to the reduction in the total duration of the erasure process.

Elimination of the write cycle and of the time-out previously present in the checking loop is made possible by an arrangement of the logic for supervising the programmable memories relating to the method according to the invention, as illustrated in the diagram of FIG. 2.

Figure 4:
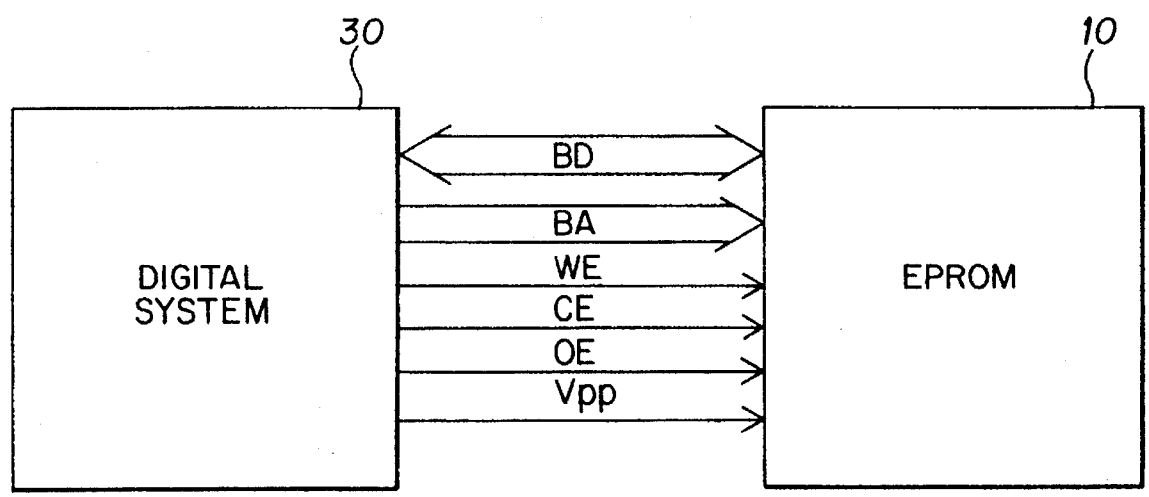
FIG. 4 is a block diagram of the EPROM and the digital system that executes the erasure algorithm.

The EPROM-type programmable memory 10 comprises, by way of example and in accordance with the current state of the art, a memory plane PM, a two-way internal databus 11 connected via an external databus BD to the outside digital system, a one-way internal address bus 12 connected through an address register RA to an external address bus BA controlled by the outside system. The interconnections of the external digital system 30 and the EPROM 10 are shown in FIG. 4. The EPROM also receives customary validation signals CE, OE in accordance with the present state of the art. These signals are processed by a supervisory logic 21 whose structure and operation are well known to the expert and therefore will not be explained here, and which also supervises the use of the programming voltage Vpp.

The instruction register RC is connected to the internal databus 11 via a status decoder R and delivers customary signals required for the internal instruction of the memory, especially in read, erase or programming mode, and also a fast erasure-checking signal FEV specific to the invention. The instruction register RC is controlled by a datum clock signal DCLK itself generated by an edge detector 13 receiving as input a write enable signal WE, and also delivering a pulse ACLK triggered by each falling edge of the signal WE.

The address register RA is controlled by a signal ALE (address-transfer enable) resulting from a logic NAND operation performed by a logic gate 15 between the signal FEV previously inverted by an inverting gate 14 and the signal ACLK previously inverted by an inverting gate 22. Transfer of the address actually present on the external address bus BA is enabled over the internal address bus 12 as soon as one or other of the signals ACLK and FEV is at the high logic level.

The combination of the decoder R, the detector 13, the logic gates 14, 15 and 22, and the address register RA constitutes the erasure-checking device 20 according to the invention, which is normally incorporated within the memory circuit according to the techniques known to the expert.

Figure 3:
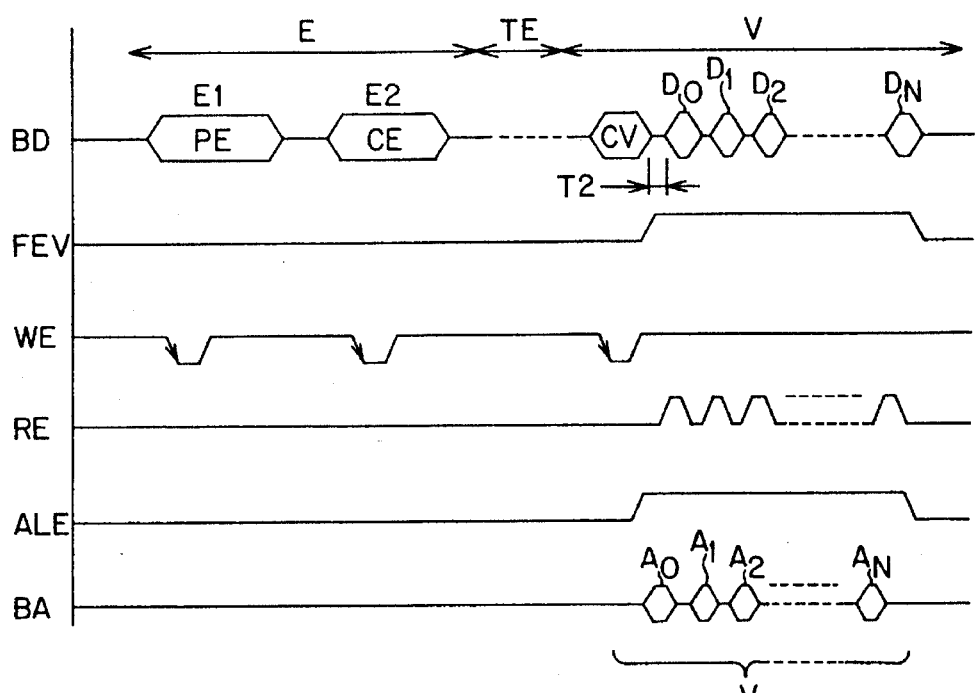
FIG. 3 is a timing diagram illustrating the sequential running of the method of checking according to the invention.

The various information transfers performed during execution of the erasure algorithm containing the erasure-checking method according to the invention will now be described with reference to the timing diagram of FIG. 3.

At the start of the erasure sequence E, the outside digital system applies a programming voltage Vpp (for example 12 volts) and generates a low pulse on the write enable input WE which, when quiescent, is at the high logic level, then delivers onto the data bus BD a prepare-for-erasure instruction word PE which is taken into account by the instruction register after decoding the signal WE. Next, the outside system again generates a low pulse on the write enable input WE, then sends an erasure instruction word CE via the databus BD. On completion of this sending, a time-out TE is performed so as to guarantee correct erasure of the entire memory plane. Next, the outside system again generates a low pulse on the write enable input WE, then an erasure-checking instruction word CV via the databus. This erasure-checking instruction word CV is decoded on completion of a pulse WE and leads to the generation of the signal FEV (cf. FIG. 2). The time-out of duration T2, for example 6 µs, is activated so as to guarantee the stabilizing of the static circuitries for reading in erasure-checking mode. Placing FEV at the high logic level causes the signal ALE to pass to the high level and therefore the register RA to open, thus becoming transparent. The outside system can then generate read cycles by applying the successive addresses A0, A1, A2, ... AN on the address bus BA, and by receiving back, on the databus BD, the respective data D0, D1, D2, ... DN for checking. The comparisons of the data read with reference data (normal digital contents expected after erasure) are naturally performed in the outside digital system as has been indicated. It is readily observed that, with the method according to the invention, the inspection of the memory plane is no longer hindered by a systematic writing of an erasure-checking instruction word which would contribute to slowing down the erasure process significantly.

The method of checking according to the invention is particularly appropriate to the FLASH EPROM memories for which it was initially devised.

Of course, the invention is not limited to the examples which have just been described and numerous other contrivances of the invention may be envisaged without departing from the scope of the present invention.

Thus, the application of the method according to the invention is not limited to a particular type of EPROM memory, but may be envisaged for any type of programmable and erasable memory.

Moreover, the opening of the address register may be effected by logic arrangements other than that described hereinabove merely by way of example, depending on the logic resources actually available within the topography of the memory circuit.

What is claimed is:

1. A method of checking post-erasure contents of an erasable permanent memory, the memory being especially of EPROM type and comprising an instruction register and an address register, the method being executed as part of an erasure sequence and comprising the steps of:

writing an erasure-checking instruction word into said instruction register once during the erasure sequence, wherein the step of writing the erasure-checking instruction word once initiates a timing-out for a predetermined duration and the following checking sequence, occurring after said timing-out;

opening of the address register;

presentation of a first address to the address register;

iteratively reading and testing the contents of the permanent memory at the presented address; and one of incrementing the address until the entire memory has been checked and executing a new erasure sequence; and one of closing of the address register when the entire memory has been checked and exiting the erasure sequence when a predetermined number of erasure sequences has been performed.

2. The method as claimed in claim 1, wherein the reading and testing step comprises the steps of:

reading a memory datum held in the presented address of the memory;

comparing said memory datum with a reference erasure datum;

performing a new reading and testing iteration when the memory datum is identical to the reference datum; and otherwise executing said new erasure sequence step when the datum is not identical to the reference datum.

3. The method as claimed in claim 2, wherein the reading and testing step further comprises a step of testing the presented address to determine if the entire memory has been checked.

4. The method as claimed in claim 2, wherein the step of executing a new erasure sequence includes a step of comparing a number of sequences which have been performed with a threshold value, and if the number of sequences exceeds the threshold value a fault indication is given.

5. A system for checking post-erasure contents of an erasable permanent memory, said system comprising;

a memory, especially of EPROM type, said memory comprising an address register, an instruction register connected to an internal data bus via a status decoder, and an edge detector receiving as an input a write enable signal;

means for writing an erasure-checking instruction word into said instruction register and timing-out for a predetermined duration, once during an erasure sequence;

means for presenting an address to the address register;

means for iteratively reading and testing contents of the memory at the address presented and for incrementing the address presented until the entire memory has been checked or a new erasure sequence is executed;

means for executing a new erasure sequence when the datum in the memory at the address presented does not match a reference datum for that address; and means, in said memory, for generating an address-transfer enable signal and for outputting the address-transfer enable signal to the address register.

6. The device as claimed in claim 5, wherein the means for generating the address-transfer enable signal comprise a two-input NAND logic gate receiving as inputs a logic inverse of an address clock signal generated by the edge detector and a logic inverse of a fast erasure-checking signal generated by the instruction register.

7. A system for checking post-erasure contents of an erasable permanent memory, the system comprising:

a memory, especially of an EPROM type, said memory comprising an address register, an instruction register connected to a first internal databus via a status decoder, and an edge detector which receives as an input a write enable signal;

a two way external databus coupled to the first internal databus which transmits an erasure-checking instruction, from a digital system external to said memory, to the first internal databus, once during a single erasure sequence;

a logic circuit for generating address-transfer enable signal to said address register which enables said address register to transfer an address present on a one way external address bus to a memory plane of the memory, the logic circuit having an input coupled to an output of the instruction register and a second input coupled to an output of the edge detector, and having an output coupled to an input of the address register;

a second internal databus having an input coupled to an output of the address register and an output coupled to an input of the memory plane, the memory plane also having an output coupled to the first internal databus, wherein said second internal databus carries the address present on the one way external databus to the memory plane, and the datum at that address is sent along said two way external databus to said digital system for checking.

8. A device as claimed in claim 7, wherein the logic circuit comprises:

an inverter having an input coupled to the output of the instruction register and an output;

a second inverter having an input coupled to the output of the edge detector and an output;

a logic gate having a first input coupled to the output of the first inverter and a second input coupled to the output of the second inverter and an output coupled to the input of the address register.

* * * * *

UNITED STATES PATENT AND TRADEMARK OFFICE
CERTIFICATE OF CORRECTION

PATENT NO. : 5,483,492
DATED : January 9, 1996
INVENTOR(S) : Olivier Rouy

It is certified that error appears in the above-indentified patent and that said Letters Patent is hereby corrected as shown below:

On title page, item

[73] Assignee: SGS-Thomson Microelectronics S.A.,
Saint Genis, Pouilly, France

Signed and Sealed this

Twenty-seventh Day of February, 1996

Attest:

BRUCE LEHMAN

*Attesting Officer*     *Commissioner of Patents and Trademarks*